(12) United States Patent
Gilet et al.

(10) Patent No.: US 8,487,340 B2
(45) Date of Patent: Jul. 16, 2013

(54) OPTOELECTRONIC DEVICE BASED ON NANOWIRES AND CORRESPONDING PROCESSES

(75) Inventors: Philippe Gilet, Têche (FR); Laurent Grenouillet, Rives (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 12/738,959

(22) PCT Filed: Oct. 22, 2008

(86) PCT No.: PCT/FR2008/001484
§ 371 (c)(1),
(2), (4) Date: Aug. 11, 2010

(87) PCT Pub. No.: WO2009/087319
PCT Pub. Date: Jul. 16, 2009

(65) Prior Publication Data
US 2011/0180776 A1    Jul. 28, 2011

(30) Foreign Application Priority Data
Oct. 22, 2007  (FR) .................................... 07 07385

(51) Int. Cl.
*H01L 21/00* (2006.01)
(52) U.S. Cl.
USPC ............................................ 257/103; 438/46

(58) Field of Classification Search
USPC ............................. 438/46–47; 257/103–104
See application file for complete search history.

(56) References Cited

U.S. PATENT DOCUMENTS

| 7,432,522 | B2 * | 10/2008 | Samuelson et al. ............. 257/12 |
| 7,781,778 | B2 * | 8/2010 | Moon et al. ..................... 257/79 |
| 2002/0172820 | A1 * | 11/2002 | Majumdar et al. ............ 428/357 |
| 2005/0253138 | A1 | 11/2005 | Choi et al. |
| 2007/0057248 | A1 | 3/2007 | Yao et al. |

FOREIGN PATENT DOCUMENTS

| JP | 2006-303508 | 11/2006 |
| JP | 2009-76896 | 4/2009 |

OTHER PUBLICATIONS

Japanese Office Action for JP 2010-529429 dated Apr. 9, 2013 with English Translation.

* cited by examiner

*Primary Examiner* — Richard Booth
(74) *Attorney, Agent, or Firm* — Morgan, Lewis & Bockius LLP

(57) ABSTRACT

The invention relates to a method for making optoelectronic devices comprising nanowire semiconductors, in which: the nanowires (2) are formed on a substrate (1), said nanowires being capable of emitting a light beam; a first electric contact area is formed at the substrate, and a second electric contact area is formed at the nanowires, characterized in that the second electric contact area is formed on the edge of the nanowires (2) in direct contact with said nanowires, on a predetermined height (h) thereof and in the vicinity of their end opposite the substrate, as well as between said nanowires, the upper surface (20) of the nanowires being exposed.

14 Claims, 5 Drawing Sheets

OPTOELECTRONIC DEVICE BASED ON NANOWIRES AND CORRESPONDING PROCESSES

RELATED APPLICATIONS

Figure 1:
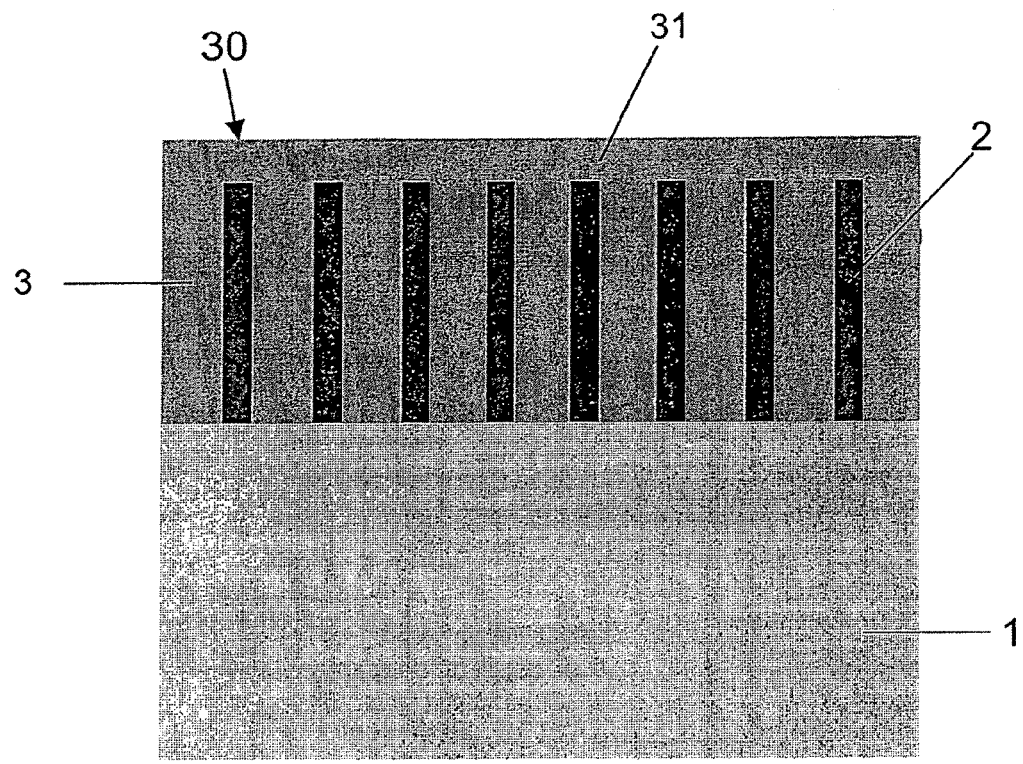

The present application is a U.S. National Phase Application of International Application No. PCT/FR2008/001484 (filed Oct. 22, 2008), which claims priority to French patent application Ser. No. 07/07385 (filed Oct. 22, 2007), all of which is hereby incorporated by reference in their entirety.

The invention relates to the field of optoelectronics and in particular to radiation emitters using semiconductors and photoreceptors.

Conventionally, optoelectronic devices such as light-emitting devices, of the LED (light-emitting diode) type, or lasers are obtained by successive epitaxial growth of various semiconductor materials.

Thus, the family of III-N materials (GaN, AlN, etc.) has good physical properties for producing light-emitting diodes for wavelengths ranging from the near UV into the green.

However, these materials have a major problem.

This is because there is no suitable substrate, in terms of lattice parameter, defect density and size, enabling planar layers of good crystalline quality to be grown. Owing to the high refractive index of semiconductors, which is between 2 and 3.5, a substantial portion of the light emitted within the material cannot therefore emerge therefrom.

These deleterious effects may be conventionally reduced by making the surface of the diode rough.

However, recently a novel material structure enabling this problem to be solved has appeared. This is a structure based on nanowires, which are semiconductors having a transverse dimension of nanoscale size. Thus, the typical diameter of a nanowire ranges from a few tens of nanometers to a few hundred nanometers, whereas its total height is of the order to a micron.

These nanowires may be produced on substrates the lattice parameter of which differs substantially therefrom, and may also improve the light extraction.

It is thus possible to produce nanowires with good structural and physical properties.

As regards light extraction, each nanowire may be considered as a waveguide. Owing to its practically cylindrical form, its size and its refractive index (higher than the ambient medium), the light is guided substantially parallel to the growth axis of the nanowires. Thus, the light arrives at the end of a nanowire at a small angle to the axis thereof, i.e. an angle below the limit angle for total reflection, thereby facilitating light extraction. This is why optoelectronic components such as LEDs or laser diode employing nanowires have already been produced.

When the nanowires are designed to emit light and not just to guide light, they include a p-n junction.

The processes employed consist firstly in obtaining nanowires on a substrate. These processes have been extensively described in the prior art. In particular, the reader may refer to document WO 2004/088755 which refers to the VLS (vapor liquid solid) process.

The nanowires may for example be based on materials from the III-N family, GaAs, ZnO or InP, for example on a silicon or sapphire substrate.

The process then consists in filling the interstices between the nanowires by depositing a layer of an electrically insulating dielectric, for example of the $SiO_2$ type, the thickness of which is greater than the height of the nanowires. The material must therefore properly fill the interstices.

The next step consists in planarizing this layer, while eliminating the surplus dielectric on top of the nanowires. What is thus obtained is a planar surface, the upper end of the nanowires being flush with said surface.

If the deposited material is a planarizing material, the planarization step is omitted.

Another step then consists in depositing, on this planar surface, a semitransparent conducting layer that comes into contact with the upper face of the nanowires. Conventionally, this layer is made of ITO (indium tin oxide). After this ITO layer has been deposited over the entire surface, geometric features are defined using conventional microelectronic techniques of the photolithography type. Finally, electrical contacts are formed, one on the substrate and the other on the semitransparent conducting layer.

The reader may in particular refer to the following article: "High-Brightness Light Emitting Diodes Using Dislocation-Free Indium Gallium Nitride/Gallium Nitride Multiquantum-Well Nanorod Array", Nano Letters 2004, Vol. 4, No. 6, 1059-1062.

This process makes it possible to obtain a component of the LED or laser diode type in which the light emission takes place through the semitransparent layer.

However, the presence of this semitransparent layer has considerable drawbacks.

This is because such a layer must be as conducting as possible. However, most materials having good electrical conductivity absorb light. Moreover, this layer must also be highly transparent in order to allow good light extraction.

Consequently, since the technical characteristics that this layer must have are conflicting, the chosen materials result from a compromise. Thus, it is general practice either to use a semitransparent semiconductor layer, for example made of certain oxides such as ITO or ZnO, or else metallic materials deposited as a thin film, the thickness of which is less than 5 nm.

The object of the invention is to alleviate these drawbacks by providing a process for fabricating an optoelectronic device based on semiconductors of the nanowire type that makes it unnecessary for a semitransparent conducting layer covering the surface of the nanowires to be present.

This process therefore makes it possible to obtain optoelectronic devices for which there is practically no loss of emitted light.

Thus, the invention relates to a process for fabricating optoelectronic devices based on nanowire-type semiconductors, in which:

nanowires are produced on a substrate, said nanowires being capable of emitting a light beam;
a first electrical contact zone is produced on the substrate; and
a second electrical contact zone is produced on the nanowires, characterized in that the second electrical contact zone is provided on the periphery of the nanowires and in direct contact with the nanowires, over a defined height h thereof and close to their end on the opposite side from said substrate, and also between said nanowires, the upper face of the nanowires being exposed.

This process is also characterized in that the second electrical contact zone is obtained by depositing a layer of electrically conducting material.

The invention also relates to another process for fabricating optoelectronic devices based on nanowire-type semiconductors.

This process comprises the following steps:
nanowires are obtained on a substrate, said nanowires being capable of emitting a light beam; and
a layer of material is deposited in order to fill the interstices between the nanowires, said layer being optionally planarized subsequently,
characterized in that it includes steps for obtaining a layer of an electrically conducting material on the periphery of said nanowires and in direct contact with the nanowires, over a defined height h and on their ends on the opposite side from said substrate, and between said nanowires, the upper face of said nanowires being bared.

In a preferred method of implementing this application process, the steps for obtaining a layer of an electrically conducting material consist in:
etching said layer of material so as to bare the upper end of the nanowires over a defined height h;
depositing a layer of electrically conducting material over said height h of the nanowires;
depositing another layer of a material in order to fill the interstices between the nanowires, optionally followed by a planarization step;
etching said other layer of material in order to expose the upper part of the nanowires;
etching said layer of electrically conducting material in order to bare the upper face of the nanowires;
removing the electrically conducting material present on the upper face of the nanowires; and finally
removing the other layer of material still present on the electrically conducting material.

The processes are also characterized by the following additional features:
the nanowires are doped with suitable carriers in order to ensure good electrical continuity between the substrate and the nanowires;
the nanowires are doped over the height h with carriers of opposite conductivity to that of the carriers present in the rest of the nanowires;
the contact between the nanowires and the substrate is made directly or indirectly;
metal wires are bonded to each of said electrical contact zones; and
a final layer of phosphorescent material is deposited so as to cover the upper face of the nanowires.

The invention also relates to an optoelectronic device comprising at least one nanowire-type semiconductor, having a waveguide structure and being capable of emitting a light beam, and two electrical contact zones, one of the zones being located on the periphery of said at least one nanowire, in direct contact with said at least one nanowire and close to one of its ends, the upper face of said nanowire not participating in the electrical contact.

This device is also characterized by the following additional features:
the electrical contact zone located on the periphery of said at least one nanowire is formed by a layer of an electrically conducting material that leaves the upper face of the nanowire exposed;
said at least one nanowire is doped in the electrical contact zone located on its periphery with carriers of opposite conductivity to that of the carriers present in the rest of the nanowire; and
a layer of a phosphorescent material covering the upper face of said at least one nanowire in order to convert the light emanating from said nanowire into white light.

The invention will be better understood and other objects, advantages and features thereof will become more clearly apparent on reading the following description, given with regard to the appended drawings in which FIGS. 1 to 10 show various steps of the processes according to the invention for obtaining optoelectronic devices based on nanowire-type semiconductors.

The elements common to the various figures will be denoted by the same references.

Of course, the following description is given merely by way of example and is absolutely not limiting.

The first step of these processes consists in producing nanowires on a substrate, these nanowires having a waveguide structure.

To give an example, nanowires may be obtained on a highly n-doped (111) silicon substrate 1, and therefore on a good electrical conductor, by any appropriate process. Thus, nanowires of the family of III-V materials may be obtained by MEB (molecular beam epitaxy) or by MOCVD (metal organic chemical vapor deposition) without a catalyst.

The density of nanowires obtained will be about a few $10^8$ $cm^{-2}$ and the nanowires will have a height of 3 μm for a diameter of about 300 nm.

When the diameter of the nanowires is large enough, the optical field of the light beam emitted by the nanowires may be considered to be essentially confined inside the nanowires. Thus, the loss from the light beams emitted by the nanowires is very small.

To obtain this property, it is necessary for the diameter of the nanowires to be of the order of magnitude of the wavelength divided by the refractive index of the nanowire.

The wavelengths in question within the context of the present invention lie between 200 nm and a few microns. It is therefore necessary for the nanowires to have a diameter greater than a few hundred nanometers, given the optical index of the material.

These nanowires are designed to generate and emit a light beam. They include a p-n junction made of GaN material, in the middle of which there will be three InGaN quantum wells. By photoluminescence measurement, these wells emit at a wavelength close to 450 nm.

In this example, the nanowires are n-doped at the substrate so as to ensure good electrical continuity between the substrate and the nanowires.

As will be explained later, the nanowires will be doped with p-type carriers on their upper ends, on the opposite side from the substrate. This doping will be carried out over a defined height h, which will be precisely indicated in the rest of the description.

Finally, the nanowires may either be in direct contact with the silicon substrate or in indirect contact therewith, a thin layer of AlN doped with n-type carriers then being inserted between the substrate and the nanowires.

The next step consists in depositing a layer of planarizing material on the wafer obtained, so as to fill the interstices between the nanowires.

The material used may be a planarizing polymer widely employed in the microelectronics field, for example of the BCB or polyimide type.

In the particular case described, the polymer used is the polymer Accuflo T27 from the company Honeywell.

As illustrated in FIG. 1, the planarizing material 3 completely fills the space between the nanowires 2, while forming on the top of them a smooth planar surface 30.

Figure 2:
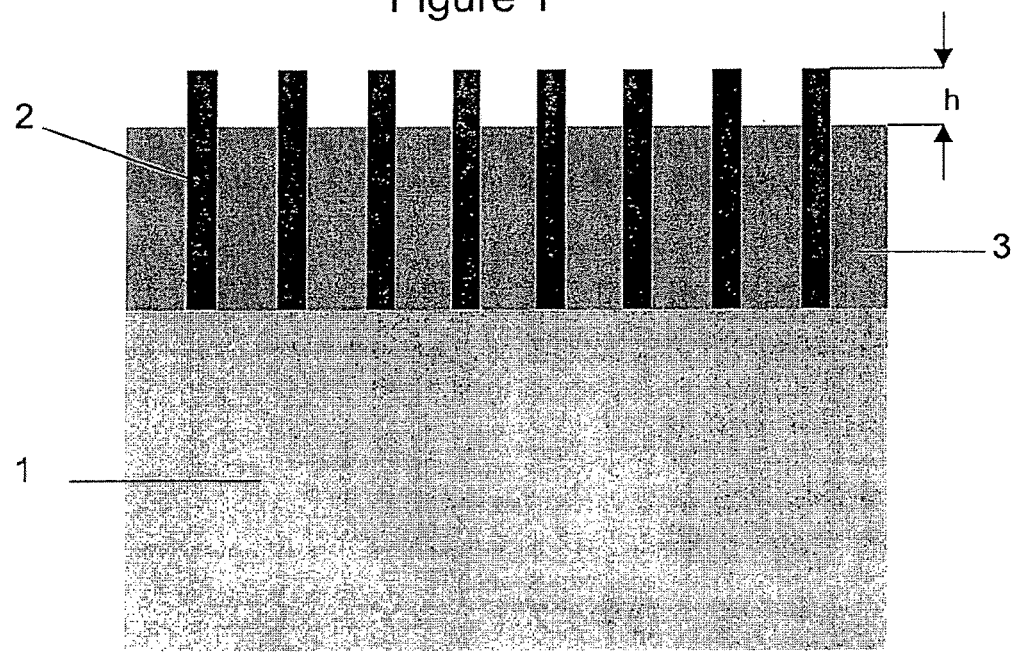

The next step, illustrated in FIG. 2, consists in etching the layer 3 of planarizing material.

As is known, an oxygen-based RIE (reactive ion etching) or barrel plasma etcher is used. Of course, the parameters adopted depend on the equipment used.

The etching rate adopted is typically around 50 nm/min.

In the abovementioned etcher, the oxygen plasma created enables the planarizing polymer layer to be uniformly etched.

By suitably calibrating the etching rate, as is well known to those skilled in the art, the layer 3 may be etched so as to eliminate the part 31 of the layer 3 that extends beyond the nanowires 2. The etching is then continued so that the upper end of the nanowires projects from the layer 3 over a defined height h.

For example, this height h may be between 200 and 500 nm. It is over this height that the nanowires are predoped with p-type carriers.

It should be pointed out that, contrary to that illustrated by FIGS. 1 and 2, the nanowires produced by epitaxy may have variable lengths.

Consequently, the process of the prior art described above makes it possible to form a contact, via the semitransparent conducting layer, only in the case of nanowires of sufficiently large length. To be able to form a contact on all the nanowires, a prior polishing step is necessary in order to reduce the length of the longest nanowires.

As will be apparent in the rest of the description, the invention makes it possible to contact all of the nanowires, even if they are of different sizes, insofar as the layer of planarizing material is etched sufficiently enough to expose all of the nanowires.

Figure 3:
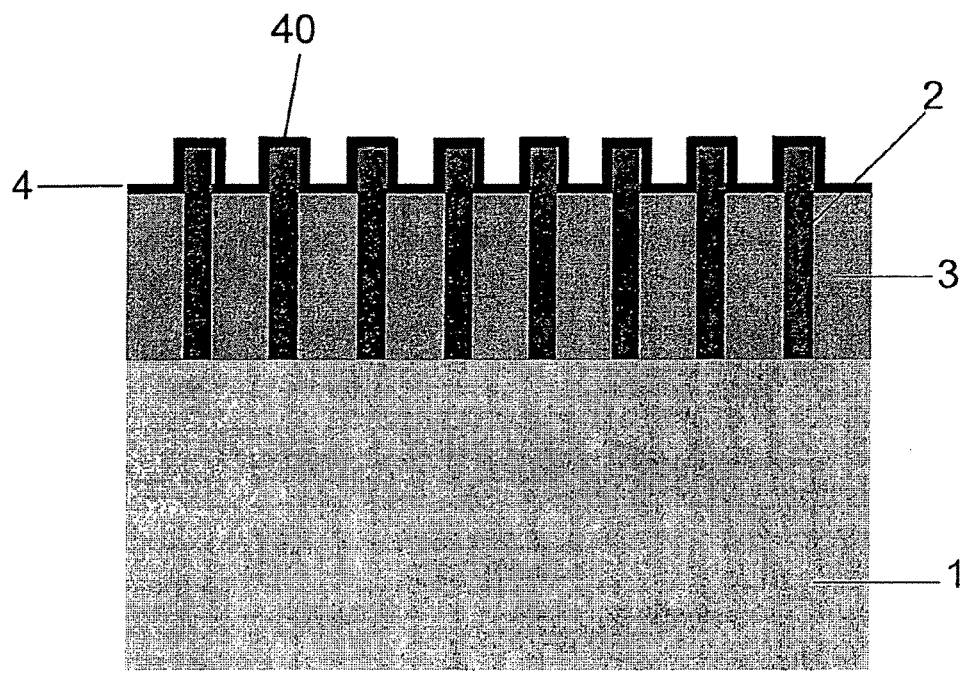

The next step will be described with reference to FIG. 3, and consists in depositing a layer 4 of an electrically conducting material on the nanowires. This layer is continuous.

This layer of electrically conducting material may for example be in the form of two layers, one a layer of nickel and the other a layer of gold, these layers being deposited by vacuum evaporation with thicknesses of about 20 nm and 200 nm respectively. The evaporation may be carried out by conventional processes, for example in an electron-beam-assisted evaporator, or else by cathode sputtering.

Under these conditions, the nickel and gold layers are deposited under vacuum (with a pressure of the order of $10^{-7}$ mbar) at a rate of 0.5 nm/s.

The edges of the wafer are then defined by the conventional "lift-off" technique, described in particular by S. Wolf and R. N. Tauber in "Silicon Processing for the VLSI Era, Vol. 1, Lattice Press".

Figure 4:
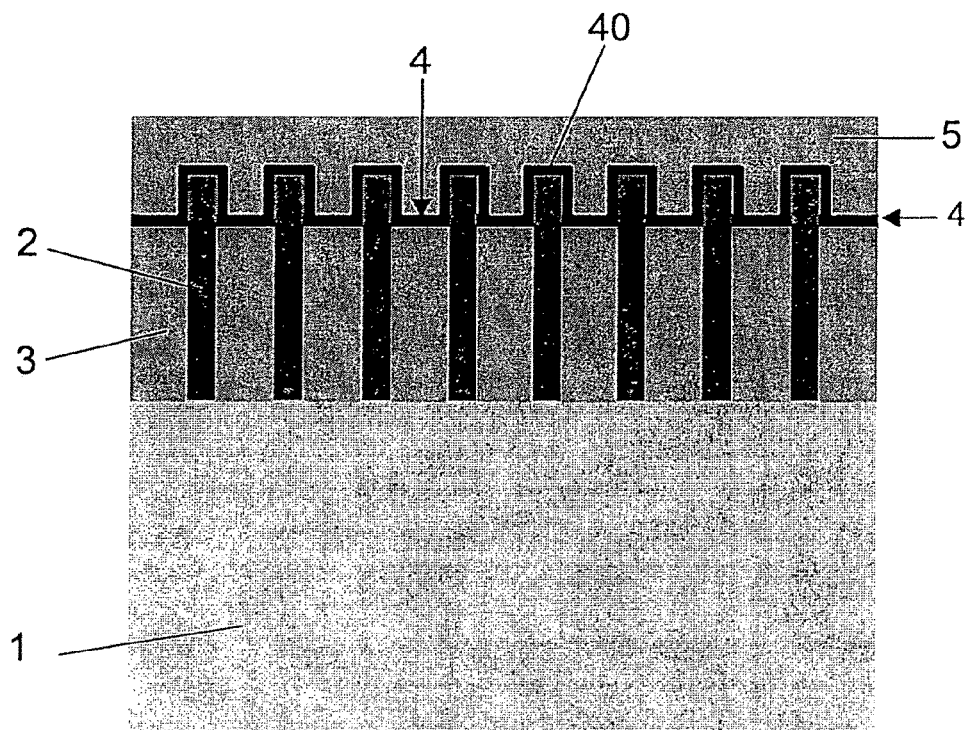

The next step is illustrated with reference to FIG. 4, which consists in depositing a layer 5 of a planarizing material on the layer 4 of electrically conducting material.

This layer 5 is deposited in a manner similar to that of the layer 3 described with reference to FIG. 1.

Figure 5:
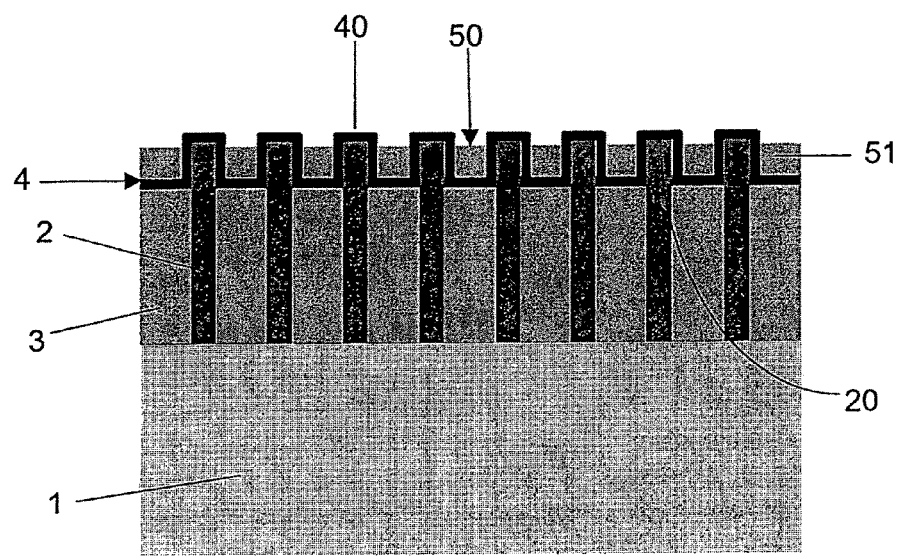

The next step is illustrated in FIG. 5, which is a step in which the layer 5 of planarizing material is etched.

This etching may be carried out using the abovementioned etcher with an oxygen plasma.

The etching parameters are chosen so that the parts 40 of the layer 4 of conducting material directly in contact with the upper face 20 of the nanowires one exposed. Thus, as FIG. 5 illustrates, the parts 40 of the layer 4 extend slightly beyond the surface 50 of the remaining layer 51.

It will be understood here that the height of the nanowires may be variable. All that is required is to adapt the etching parameters so that all the parts 40 are exposed, the layer 51 maintaining a substantially constant height.

Figure 6:
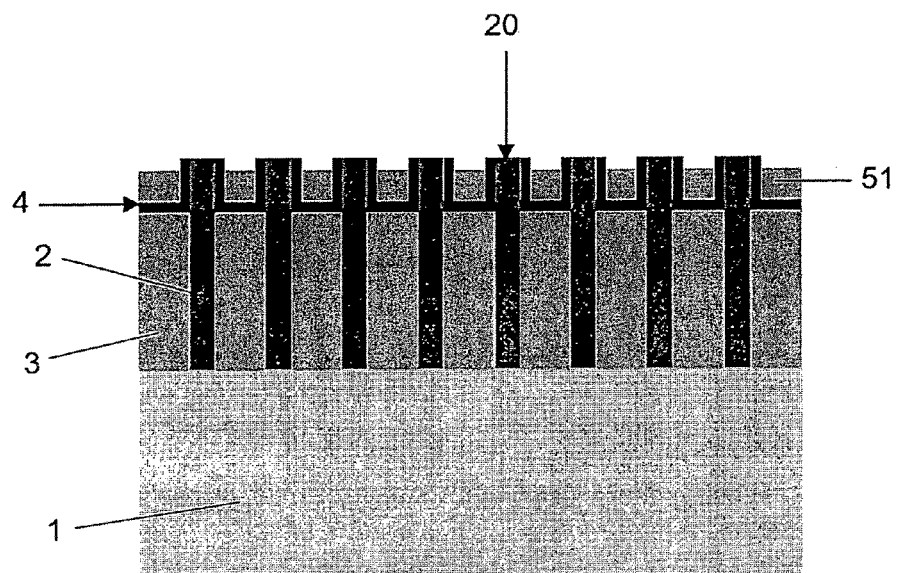

FIG. 6 illustrates another etching step, which consists in etching the layer 4 of conducting material so that the conducting material present on the upper face 20 of the nanowires is removed. In practice, this amounts to removing the parts 40 of the layer 4.

If the layer 4 is formed from two layers, one being a gold layer and the other a nickel layer, the gold layer is etched by wet etching carried out with a potassium iodized solution while the nickel layer may be etched in particular with an ammonium peroxide disulfate solution mixed with $FeCl_3$ in respective proportions of 0.8 mol/l and 0.09 mol/l.

Preferably, the etching is carried out at 50° C. and the etching rate is around 30 nm/s in the case of nickel, whereas it is around 20 nm/s in the case of gold.

Figure 7:
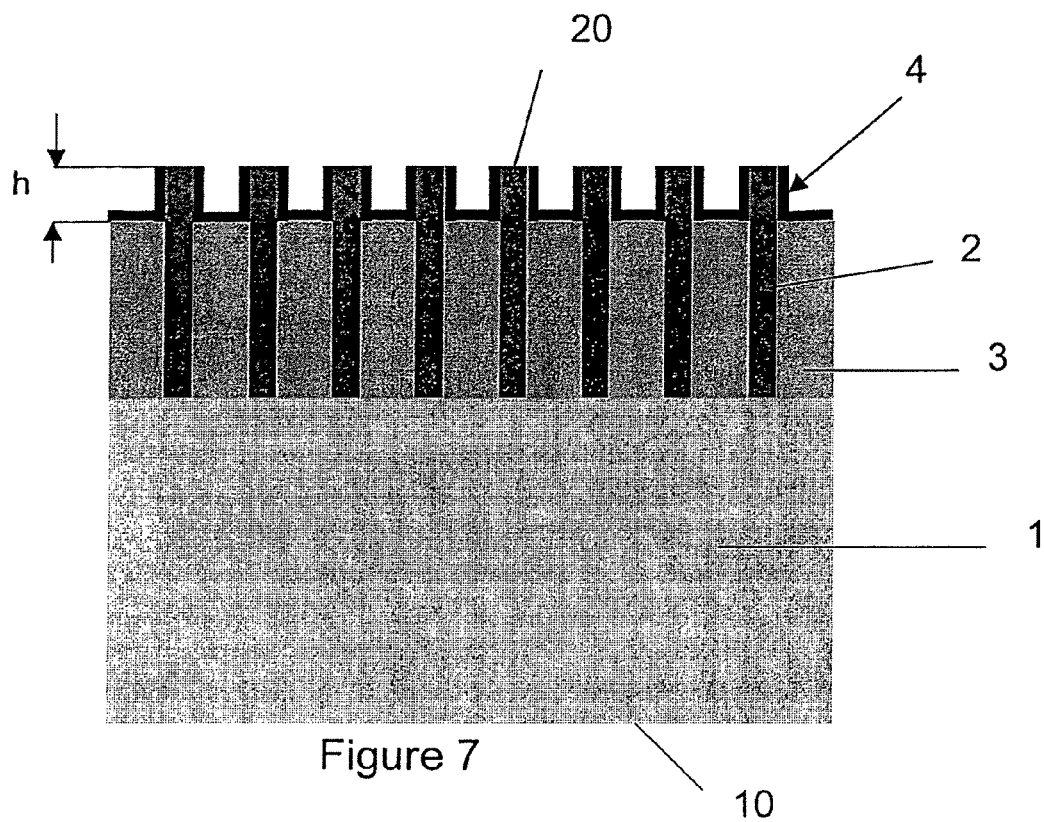

FIG. 7 illustrates the next step, consisting in completely removing the layer 51 of planarizing material that remains. It is removed by etching with an oxygen plasma.

FIG. 7 illustrates the result obtained.

Thus, at this stage in the fabrication of the opto-electronic device according to the invention, one of the electrical contact zones is produced over the height h of the nanowires. This contact zone takes the form of a layer of electrically conducting material formed on the periphery of the nanowires and in direct contact with the nanowires. This means that no material is provided between this layer of conducting material and the nanowires. The layer of electrically conducting material is present both over the height h of the nanowires and between the nanowires themselves. Because of the etching carried out in the step illustrated in FIG. 6, the upper face 20 of the nanowires 2 is exposed.

Figure 8:
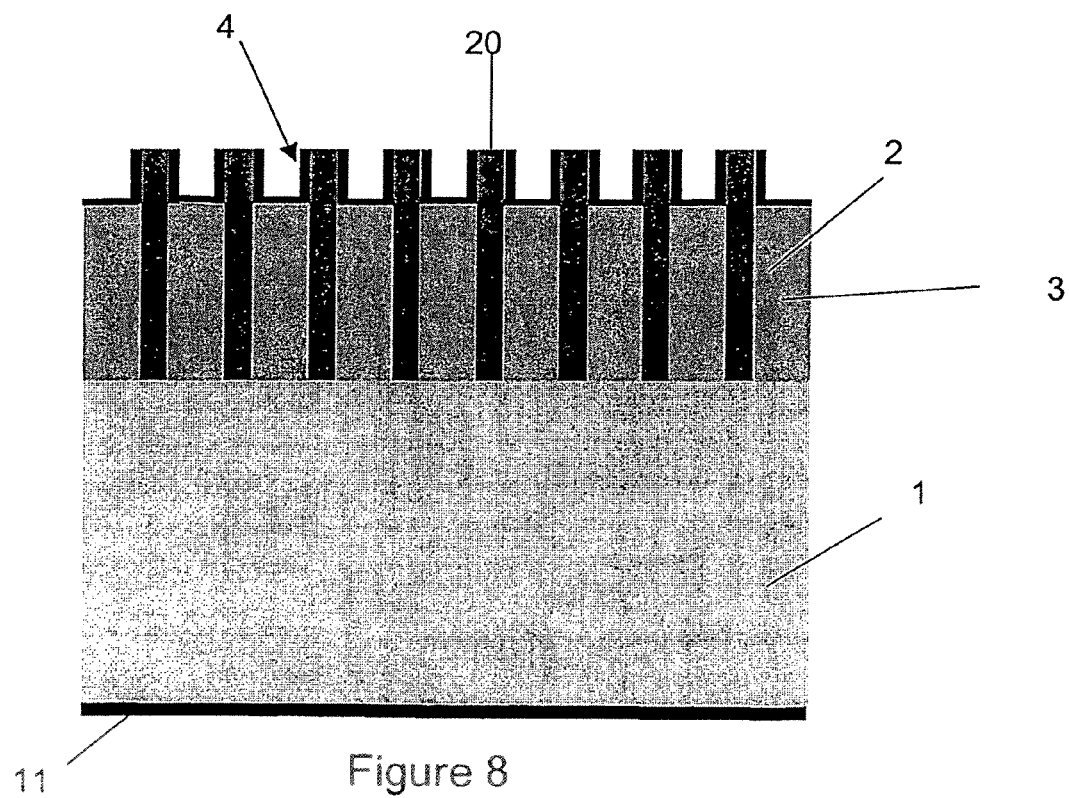

The other electrical contact zone must be created on the free face 10 of the substrate. The contact zone on the substrate 1 bears the reference 11 and is illustrated in FIG. 8. As indicated previously, the substrate used in the example illustrated is a silicon substrate doped with n-type carriers.

The substrate is therefore conducting and enables the current to be injected uniformly into the nanowires.

In the example illustrated, electrical continuity exists between the substrate and the nanowires.

Conventionally, if this is necessary, the device obtained may be cut to the desired size by sawing.

Figure 9:
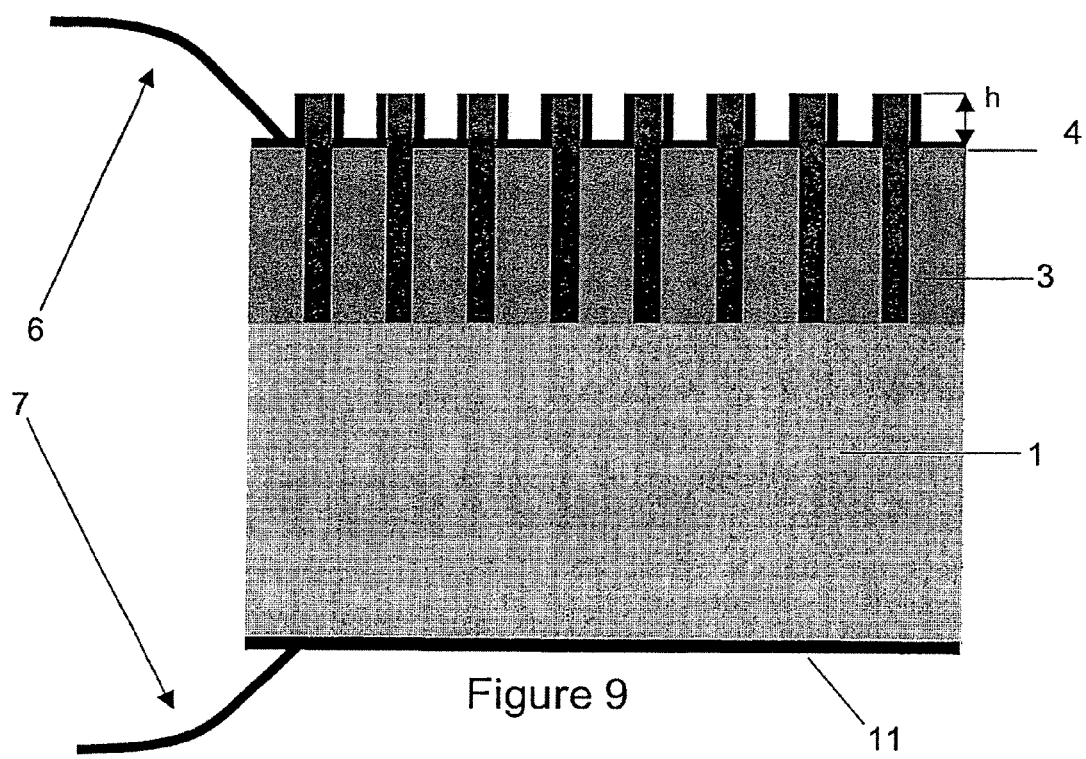

FIG. 9 illustrates the final step for completing the optoelectronic device according to the invention.

This step consists in bonding metal wires 6 and 7 on one side to the layer 4 and on the other side to the contact zone 11.

In use, i.e. when an electrical current is applied to the device, the nanowires emit light because of recombinations at their p-n junctions.

Figure 10:
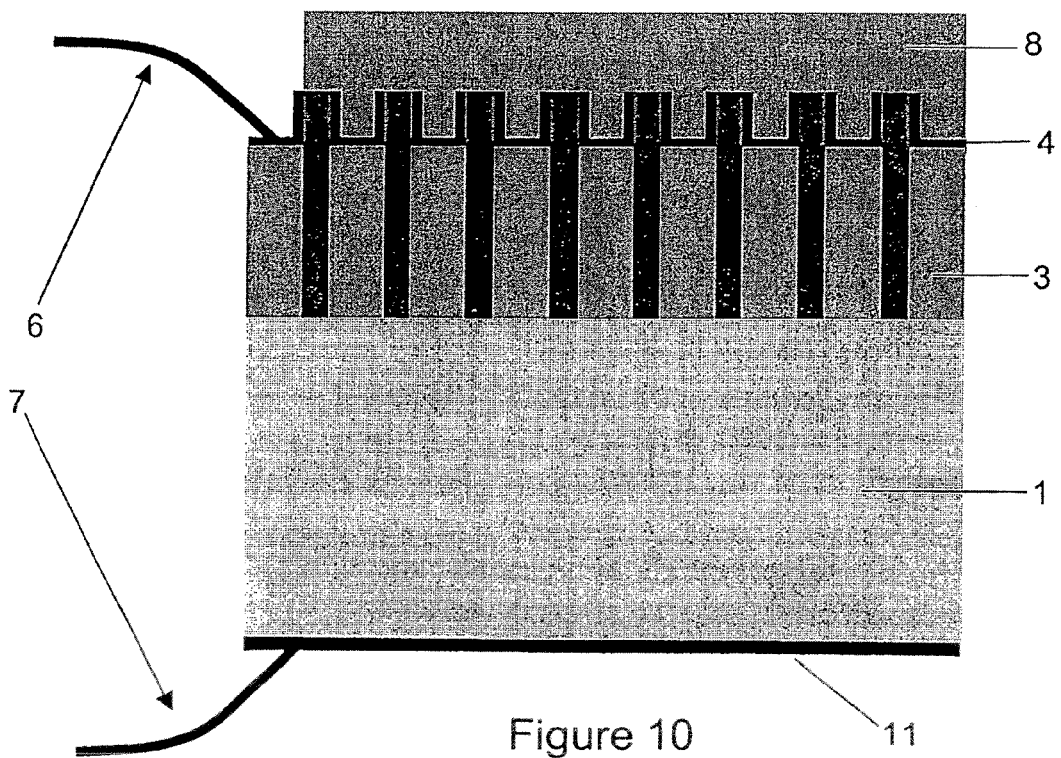

FIG. 10 illustrates an alternative method of implementing the process of the invention in which an additional layer 8 containing a phosphorescent material, for example a cerium-doped YAG (yttrium aluminum garnet), is deposited on the surface of the device. This phosphorescent material enables the quasi-monochromatic light emanating from the diode to be converted to white light, i.e. light made up of a broad spectrum of wavelengths.

It should be noted that the optoelectronic device according to the invention has an axial functional structure, i.e. each nanowire has p-type and n-type zones that are arranged in succession along the axis of the nanowires. This structure differs from radial functional structures in which the p-type and n-type zones are provided on the periphery of the nanowire. In this case, the p-type and n-type zones are placed in succession in a direction perpendicular to the axis of the nanowires. Document US-2007/0057248 describes for example such a radial functional structure.

In devices with an axial structure, the light is emitted from quantum wells. The light emission from these wells is anisotropic. In devices having an axial structure, this emission couples better with the guided modes of the nanowires, thereby facilitating light extraction. In the case of devices having a radial structure, it is difficult for the light emission to couple with the guided modes of the nanowires. The light emerges directly from the nanowires and enters the planarizing material that surrounds the nanowire, or is absorbed by a peripheral metal contact.

The above description shows that the process according to the invention makes it possible to obtain an opto-electronic device based on electronic semiconductors of the nanowire type designed to emit a light beam in use, without it being necessary to have a semitransparent conducting layer covering the surface of the nanowires.

The electrical contact on the nanowires is obtained by the presence of a conducting material on the periphery of the nanowires and in direct contact therewith, this material being provided on their ends on the opposite side from the substrate. Moreover, the upper face of the nanowires is completely exposed. This makes it possible to produce a contact, on the opposite side from the substrate, without impeding the light emission from the nanowires.

Moreover, the solution according to the invention makes it possible to increase the contact area of a nanowire since the contact height h is greater than half the radius. This is because, for a conventional device, the contact area is equal to $\pi r^2$, whereas it is equal to $2\pi rh$ for a device according to the invention.

This leads to two substantial advantages:
firstly, it is possible to reduce the contact resistance for constant layer doping. Thus the devices may operate at a lower voltage or may consume less for a constant voltage;
secondly, it is possible to reduce the doping of the nanowire over the height h intended to be covered by the conducting materials for a constant contact resistance. This is possible also to reduce the light absorption by the free carriers and therefore to increase the light extraction efficiency of the optoelectronic device obtained.

It will be understood in the above description that the deposition of a layer of planarizing material may be replaced by deposition of a layer of material filling the interstices, followed by a planarization step.

As was noted above, the process according to the invention makes it possible to contact all the nanowires, even if they are of different height, without it being necessary to polish them beforehand.

Finally, the process according to the invention makes it possible to obtain optoelectronic devices of the LED, laser diode or photodetector type.

The invention claimed is:

1. A process for fabricating of optoelectronic devices based on nanowire-type semiconductors having an axial functional structure, in which:
    nanowires are produced on a substrate, said nanowires being capable of emitting a light beam by themselves and having p-type and n-type zones that are arranged in succession along the axis of the nanowires;
    a first electrical contact zone is produced on the substrate; and
    a second electrical contact zone is produced on the nanowires,
characterized in that the second electrical contact zone is provided on the periphery of the nanowires and in direct contact with the nanowires, over a defined height (h) thereof and close to their end on the opposite side from said substrate, and also between said nanowires, the nanowires being doped over said defined height (h) with carriers of opposite conductivity to that of the carriers present in the rest of the nanowires and having a waveguide structure, the upper face of the nanowires being exposed so that the emitted light is guided to said upper face through which it is extracted.

2. The process as claimed in claim 1, in which the second electrical contact zone is obtained by depositing a layer of electrically conducting material.

3. A process for fabricating an optoelectronic device based on nanowire-type semiconductors having an axial functional structure, comprising the following steps:
    nanowires are obtained on a substrate, said nanowires being capable of emitting a light beam by themselves and having p-type and n-type zones that are arranged in succession along the axis of the nanowires;
    a first layer of material is deposited in order to fill the interstices between the nanowires, said layer being optionally planarized subsequently,
characterized in that it includes steps for obtaining a second layer of an electrically conducting material on the periphery of said nanowires and in direct contact with the nanowires, over a defined height (h) and on their ends on the opposite side from said substrate, and between said nanowires, the nanowires being doped over said defined height (h) with carriers of opposite conductivity to that of the carriers present in the rest of the nanowires and having a waveguide structure, the upper face of the nanowires being bared so that the emitted light is guided to said upper face through which it is extracted.

4. The process as claimed in claim 3, in which the steps for obtaining the second layer of an electrically conducting material consist in:
    etching said first layer of material so as to bare the upper end of the nanowires over a defined height (h);
    depositing the second layer of electrically conducting material over said height (h) of the nanowires;
    depositing a third layer of a material in order to fill the interstices between the nanowires;
    etching said third layer of material in order to expose the upper part of the nanowires; and
    etching the second layer of electrically conducting material in order to bare the upper face of the nanowires.

5. The process as claimed in claim 1, in which the nanowires are doped with suitable carriers in order to ensure good electrical continuity between the substrate and the nanowires.

6. The process as claimed in claim 1, in which the contact between the nanowires and the substrate is made directly or indirectly.

7. The process as claimed in claim 1, in which the metal wires are bonded to each of said electrical contact zones.

8. The process as claimed in claim 1, in which a final layer of phosphorescent material is deposited so as to cover the upper face of the nanowires.

9. An optoelectronic device comprising:
    at least one nanowire-type semiconductor having an axial functional structure, each nanowire having a waveguide structure and being capable of emitting a light beam by itself and having p-type and n-type zones that are arranged in succession along the axis of the nanowire, and
    two electrical contact zones, one of the zones being located on the periphery of said at least one nanowire, in direct contact with said at least one nanowire, over a defined height (h) thereof and close to one of its ends,
    the said at least one nanowire being doped over said height (h) with carriers of opposite conductivity to that of the carriers present in the rest of the nanowire,
    the upper face of said nanowire being exposed so that it does not participate in the electrical contact and the emitted light is guided to said upper face through which it is extracted.

10. The optoelectronic device as claimed in claim 9, in which the electrical contact zone located on the periphery of said at least one nanowire is formed by a layer of an electrically conducting material that leaves the upper face of the nanowire exposed.

11. The device as claimed in claim 9, which includes a layer of a phosphorescent material covering the upper face of said at least one nanowire in order to convert the light emanating from said nanowire into white light.

12. The process as claimed in claim 4, in which the steps for depositing a third layer of a material in order to fill the interstices between the nanowires is followed by a planarization step.

13. The process as claimed in claim 1, in which the second electrical contact zone is produced directly on the nanowires.

14. The process as claimed in claim 4, in which a final step consists in removing the third layer of material still present on the electrically conducting material.

* * * * *